Dec. 18, 1956 R. H. WATSON 2,774,943

FREQUENCY MODULATED OSCILLATOR

Filed June 30, 1952 2 Sheets-Sheet 1

INVENTOR.
Robert H. Watson
BY Flehr & Swain
ATTORNEYS

Dec. 18, 1956 R. H. WATSON 2,774,943

FREQUENCY MODULATED OSCILLATOR

Filed June 30, 1952 2 Sheets-Sheet 2

INVENTOR.
Robert H. Watson
BY Fleher & Swain
ATTORNEYS

United States Patent Office 2,774,943

Patented Dec. 18, 1956

2,774,943

FREQUENCY MODULATED OSCILLATOR

Robert H. Watson, Sunnyvale, Calif., assignor to Sierra Electronic Corporation, San Carlos, Calif., a corporation of California Application June 30, 1952, Serial No. 296,365

1 Claim. (Cl. 332—28)

This invention relates generally to high frequency electronic oscillators which can be frequency modulated or otherwise varied over a substantial range with respect to its operating frequency.

In various electronic systems it is frequently desirable to provide a high frequency electronic oscillator which can be frequency modulated as by keying or by sound or other signal frequencies. In such instances it is usually important to have a high degree of stability with respect to the frequency of operation, thereby avoiding any undesired frequency shifts. Conventional crystal-controlled oscillators are not suitable for this purpose because the permissible range of frequency shift is not sufficient for useful frequency modulation.

It is an object of the present invention to provide a crystal-controlled oscillator which is satisfactory for frequency modulation.

A further object of the invention is to provide an oscillator of the above character which has a high degree of stability, and which is relatively simple with respect to the component circuit elements employed.

Another object of the invention is to provide an oscillator of the above character which is well adapted to frequency modulation by application of a controlling modulating voltage or by movement of a single mechanical part.

Additional objects and features of the invention will appear from the following description in which the preferred embodiments of the invention have been set forth in detail in conjunction with the accompanying drawings.

Referring to the drawings.

Figure 1:
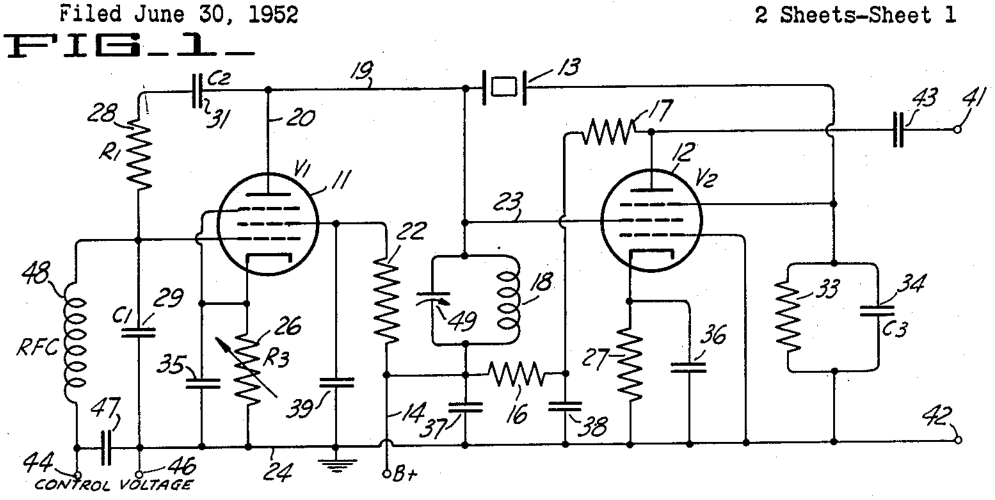
Figure 1 illustrates a high frequency oscillator incorporating the present invention.

The circuit illustrated in Figure 1 consists of a variable reactance tube 11, together with the amplifier tube 12. Both tubes can be of the multigrid type. There is also a crystal resonator 13 which may be of conventional type, and which is selected to have a suitable resonant frequency.

Conductor 14 connects to the positive side of the B voltage supply, and is connected to the plate of tube 12 through the series connected resistors 16 and 17. It also connects to the plate of the reactance tube 11, through the inductance 18 and conductors 19 and 20. The B battery source also provides a suitable potential for the screen grids of the tubes 11 and 12. Thus the screen grid of tube 11 connects with the conductor 14 through the resistor 22. The screen grid of tube 12 is connected by conductor 23 with conductor 19.

The cathode of the tube 11 is connected to the grounded conductor 24 through the biasing resistor 26. Resistor 27 similarly connects the cathode of tube 12 to ground.

The control grid of the tube 11 connects to phase shifting means including the resistor 28 in series with the condenser 29. One side of the condenser 29 is connected to ground, and one side of resistor 28 connects to the plate of tube 11 through the blocking condenser 31.

Reactance tube 11 has its suppressor grid directly connected to its cathode. The corresponding grid of tube 12 is connected to the grounded conductor 24, through the resistor 33, which can be shunted by the condenser 34. This condenser may be omitted in instances where the tube 12 has sufficient input capacitance. The control grid of tube 12 is connected to the grounded conductor 24.

The biasing resistors 26 and 27 are shown shunted by the by-pass condensers 35 and 36. By-pass condensers 37 and 38 connect respectively from the B battery conductor 14 to ground, and from the point of connection between resistors 16 and 17, and ground. Condenser 39 connects between the screen grid of tube 11 and ground.

Terminals 41 and 42 connect to a suitable load, such as further amplifying means, an antenna system or the like. Terminal 41 connects to the plate of tube 12 through the coupling condenser 43, while terminal 42 directly connects with the grounding conductor 24.

Assuming that the circuit is to be frequency modulated, terminals 44 and 46 are indicated for application of a control voltage. These terminals are shunted by the high frequency by-pass condenser 47, and terminal 44 connects to the control grid of tube 11 through the radio frequency choke 48.

The plate to cathode path of tube 11 is in effect shunted across the inductance 18 and forms part of an anti-resonant circuit as will be presently explained. Inductance 18 is also shunted by a small adjustable condenser 49.

Figure 4:
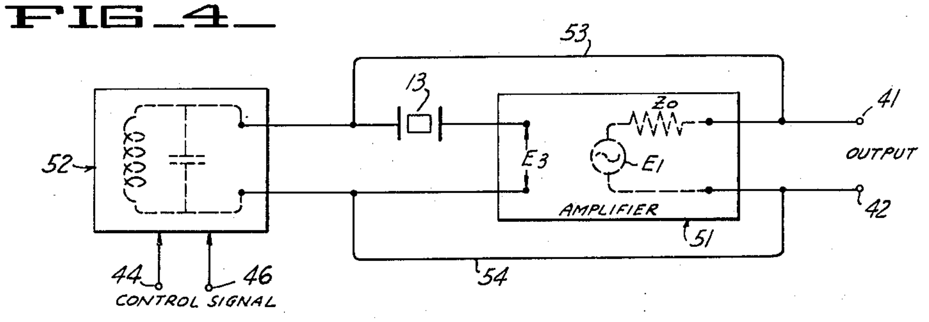
Figure 4 is a schematic circuit diagram serving to illustrate the invention in its simplest form.

The circuit of Figure 1 is schematically illustrated in Figure 4. The amplifier 51 represents the amplifier formed by the vacuum tube 12 and its associated circuits.

An anti-resonant circuit 52 is connected by conductors 53 and 54 across the output of the amplifier 51. This circuit is indicated in dotted lines as comprising inductance in shunt with capacitance. The ampifier input connects with the anti-resonant circuit in series with the crystal resonator 13. The indicated voltage $E_1$ in Figure 4 represents the amplifier equivalent generator voltage. This voltage is in phase with the amplifier input voltage $E_3$.

Figure 5:
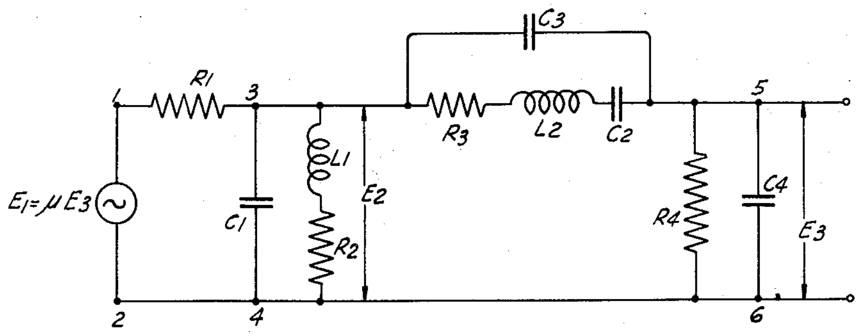
Figure 5 is a simplified circuit equivalent to Figure 4, and which facilitates an analysis of the invention.

Further explanation of Figures 1 and 4 is facilitated by the simplified equivalent circuit of Figure 5. In this circuit the amplifier output is represented by the equivalent generator voltage $E_1$, and the resistance $R_1$ represents the equivalent internal resistance of the amplifier output. The amplifier output capacitance, and the capacitance included in the anti-resonant circuit 52, are lumped together and represented by capacitance $C_1$. The inductance of the anti-resonant circuit 52 is represented by $L_1$ and the losses of the circuit by resistance $R_2$. The equivalent electrical circuit of the crystal 13 is represented by the inductance $L_2$, and the capacitances $C_2$, $C_3$ and the resistance $R_3$. Capacitance $C_4$ and resistance $R_4$ represent the input impedance of the amplifier.

When operated in accordance with my invention, the circuit 52 is anti-resonant to a frequency substantially higher than the desired operating frequency, whereby the net reactance between the points 3 and 4 is inductive. Under such conditions the voltage $E_2$ across the anti-resonant circuit leads the generator voltage $E_1$ by an angle dependent upon the magnitudes of $R_1$ and the equivalent inductance of the anti-resonant circuit. The voltage $E_3$ is shifted in phase relative to $E_2$, by the network formed by the crystal together with $R_4$ and $C_4$.

Sustained oscillations are generated when voltage $E_3$ is in phase with voltage $E_1$ and when the gain of the amplifier is sufficient to overcome the attenuation between points 1 and 2 and points 5 and 6. Voltage $E_3$ is in phase with voltage $E_1$ when the crystal and $R_4$, $C_4$ network shifts the phase of voltage $E_3$ with respect to voltage $E_2$ in an amount which is equal and opposite to that amount with which $E_2$ is shifted with respect to $E_1$. Under such conditions the frequency of ocillation is closely controlled (i. e. stabilized) by the crystal resonator, because the reactance of the crystal changes rapidly with frequency in a region near the series resonance frequency of the crystal.

In Figure 4 terminals 44 and 46 are indicated for application of a control voltage or signal. Assuming that the reactance of the anti-resonance circuit 52 is such that it is varied with variations of the control voltage, then the frequency of oscillation is varied accordingly.

In the circuit of Figure 1 the resistance provided by the tube 11 is inductive and this in parallel with inductor 18 provides the inductive reactance of the anti-resonant circuit, or in other words the major part of $L_1$ in Figure 5. Capacitor 49 together with the tube and wiring capacitance forms the major part of the capacitance $C_1$. Other components of the circuit of Figure 1 form the capacitance and resistance $C_4$ and $R_4$, which as previously stated represent the input impedance of the amplifier. The control voltage applied to the terminals 44 and 46 of Figure 1 directly controls the reactance provided by the tube 11, thus changing the reactance in a manner equivalent to changing the inductive reactance between the points 3 and 4 of Figure 5. Over a substantial range of frequency shift the relationship between the controlling voltage and the frequency of operation is substantially linear. The frequency of operation may range above or below the series resonant frequency of the crystal.

In one particular instance an oscillator was constructed in accordance with Figure 1 as follows: The vacuum tubes 11 and 12 were known by manufacturer's specification as Nos. 6AK5 and 6AS6 respectively. The various resistors had values as follows: 16—100,000 ohms; 17—470 ohms; 22—1000 ohms; 26—zero to 5000 ohms; 27—150 ohms; 28—47,000 ohms; 33—1,000,000 ohms. The condensers had values as follows: 29—15 mmf.; 31—0.001 mf.; 35—5 mmf.; 35—0.01 mf.; 36—0.01 mf.; 37—0.01 mf.; 38—0.01 mf.; 39—0.01 mf.; 43—15 mmf.; 47—0.001 mf.; and 49—4 to 23 mmf.

The inductive choke 48 had a value of 0.005 henry. The crystal 13 had a resonant frequency of 1,550,300 cycles. The resonant circuit incorporated in Figure 1 (i. e. the reactance of tube 11 in shunt with the inductance 18 and condenser 49, with zero control voltage) had a resonant frequency of about 1,700,000 cycles, which was well above the normal range of operation. The B voltage applied to conductor 14 was 105 volts. The oscillator operated at a frequency of 1,550,000 cycles for zero voltage across the terminals 44 and 46. It operated at a frequency of 1,549,000 for a controlling voltage of minus 2.2 volts. For variations of controlling voltage between plus 2.3 and minus 2.3 volts, the frequency of operation varied linearly with the controlling voltage. The circuit operated well when modulated by voice, sound or other signal frequencies, and it likewise operated well on frequency keying, by shifting the control voltage between plus and minus 2.2 volts.

The use of an adjustable rather than a fixed resistor 26 was found desirable in order to set the frequency of operation for zero control voltage.

In the foregoing example the tube 11 is connected in such a manner as to produce an inductive reactance in its plate to cathode path. However it is possible to use a type of tube connection which will produce capacitive reactance.

While modulating the circuit of Figure 1 by varying a controlling voltage is convenient and desirable, one can also modulate by mechanically varying a reactive component of the circuit, as for example the condenser 49 or a part of the inductance 18.

A desirable feature of my oscillator is that the frequency of operation can be shifted over a relatively wide range without loss of frequency stability. In this connection my oscillator can be adjusted over a considerably wider range of frequencies than conventional crystal controlled oscillators of the type having resonant circuits which are tuned for resonance at or near the frequency of operation.

Figure 2:
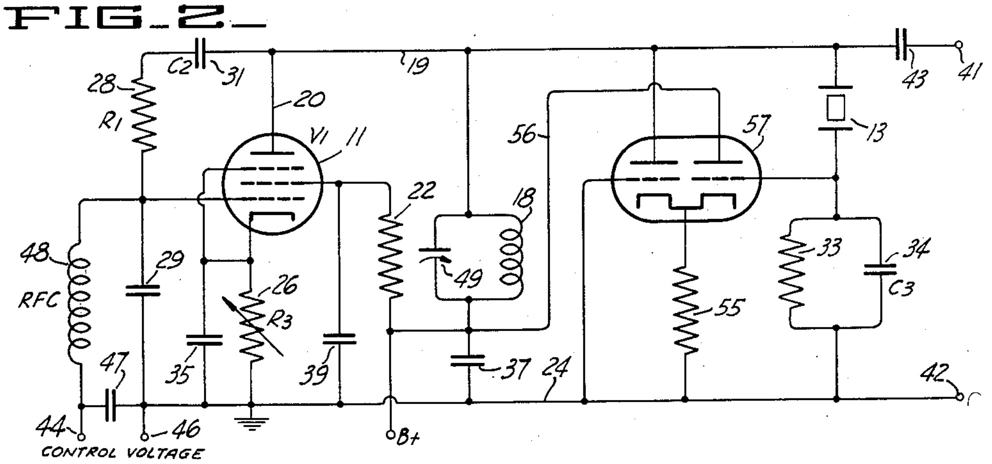
Figure 2 illustrates a modified form of oscillator making use of a two-stage cathode coupled amplifying means.

In the circuit of Figure 2 a two-stage cathode coupled amplifier has been employed in place of the simple amplifying tube 12 of Figure 1. The two cathodes of tube 57 are connected by the common resistor 55 to the grounded conductor 24. One plate is directly connected to the conductor 19, and to the output terminal 41, through the coupling condenser 43. One plate is connected by conductor 56 to the positive side of the B battery source. One control grid is connected to the grounded conductor 24, and the other is connected to one terminal of the resistor 33. The crystal resonator 13 is connected between the other plate of tube 57 and the ungrounded control grid.

The tube 57 shown in Figure 2 is of the dual triode type. While this is convenient it will be evident that various combinations of separate tubes can be used instead. For example, I can employ vacuum tubes of the type known by manufacturer's specifications as No. 5670.

The circuit of Figure 2 operates in substantially the same manner as Figure 1. The tube 57 in conjunction with the network with which it is associated, functions as a two-stage amplifying means, as is well known to those familiar with amplifiers of the two-stage cathode coupled type.

In Figure 2, as in Figure 1, an anti-resonant reactive circuit is provided by the reactance of the tube 11, in conjunction with other electrical components, including particularly the inductance 18, and capacitor 49.

Figure 3:
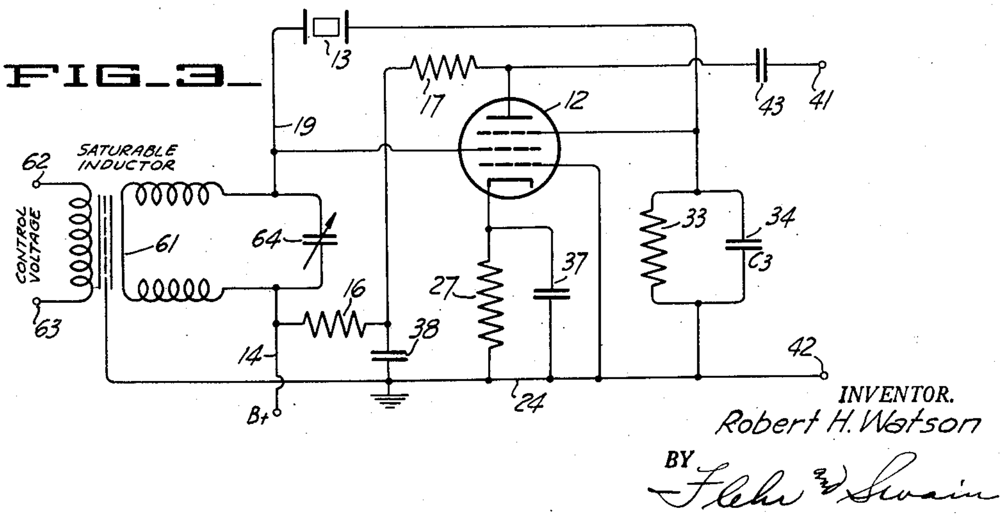
Figure 3 is another embodiment of the invention in which a saturable reactor is used in place of a variable reactance vacuum tube.

In the modification of Figure 3, a saturable inductor or reactor is employed to provide an inductive reactance which can be varied in accordance with variations of a control voltage, in place of the reactance tube 11 in Figures 1 and 2. Thus the saturable reactor 61 has its primary connected to the terminals 62 and 63 for application of a control voltage, and its secondary connected to conductor 19 and to the conductor 14 leading to the positive side of the B battery source. The secondary is shunted by the variable condenser 64. As is well known to those familiar with saturable inductors or reactors, when in operation the inductor provides an inductive reactance value depending upon the value of the applied control voltage. This inductive reactance in conjunction with the capacitance of the condenser 64, provides the anti-resonant circuit.

It will be evident from the foregoing that I have provided an oscillation generator which possesses a number of advantages over conventional systems where frequency shift keying or signal frequency modulation is desired. While in the previously stated example, the oscillator was adapted to operate over a range of from about 1,500,000 to 1,600,000 cycles, the principles of the invention can be applied to oscillators designed to operate on various selected frequency spectrums, including any frequencies for which a crystal resonator may be used.

I claim:

In an electronic oscillation generator, amplifying means including a vacuum tube having plate, control grid and cathode elements, a reactive circuit having a resonant frequency higher than the frequency range of operation of the generator and including elements of inductance and capacitance, a variable reactance tube forming a part of said circuit and having plate, control grid and cathode elements, said inductive element being connected in shunt with the plate to cathode path of the reactance tube, means serving to supply plate current to said reactance tube, phase shifting means forming a part of said circuit and including a resistor in series with a condenser and coupled across the plate to cathode path of the variable reactance tube, a lead connecting the point of connection between said resistor and condenser to the control grid of the reactance tube, a crystal resonator connected in series between the plate of the variable reactance tube and the input of the amplifier, an output lead from the amplifier connected to the plate of the variable reactance tube, said crystal resonator together with said reactive circuit forming a network connecting the output of the amplifier to the amplifier input, said reactive circuit having a resonant frequency higher than the frequency range of operation, the component values of reactance and resistance of the crystal resonator together with the component values of the amplifier input impedance being so proportioned with respect to the component reactance elements of said reactive circuit that the voltage developed across the reactive circuit leads the amplifier equivalent generator voltage and whereby the amplifier input voltage is in phase with the equivalent generator voltage, said generator serving to provide a frequency modulated signal output responsive to application of control voltage to the control grid of the variable reactance tube.

References Cited in the file of this patent

UNITED STATES PATENTS

| | | |
|---|---|---|
| 2,130,272 | Ford | Sept. 13, 1938 |
| 2,279,030 | Winlund | Apr. 7, 1942 |
| 2,294,372 | Barton | Sept. 1, 1942 |
| 2,378,581 | Roberts | June 19, 1945 |
| 2,382,615 | Donley | Aug. 14, 1945 |
| 2,515,030 | Beleskas | July 11, 1950 |
| 2,531,103 | Beckwith | Nov. 21, 1950 |